United States Patent
Huang et al.

(10) Patent No.: US 6,850,000 B1
(45) Date of Patent: Feb. 1, 2005

(54) THIN FILM TRANSISTOR ORGANIC LIGHT EMITTING DIODE STRUCTURE

(75) Inventors: Wei-Pang Huang, Hsinchu (TW); Jui-Hsing Chen, Jhongli (TW); Hsin-Hung Lee, Taipei (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 10/674,713

(22) Filed: Sep. 30, 2003

(51) Int. Cl.[7] .................................................. G09G 3/10

(52) U.S. Cl. ...................... 313/500; 313/501; 315/169.3

(58) Field of Search ....................... 315/169.3; 313/498, 313/500, 501

(56) References Cited

U.S. PATENT DOCUMENTS

| | | | |
|---|---|---|---|
| 5,684,365 A | * 11/1997 | Tang et al. | ............... 315/169.3 |
| 5,994,836 A | 11/1999 | Boer et al. | .................... 313/504 |
| 6,351,078 B1 | * 2/2002 | Wang et al. | ............. 315/169.3 |
| 6,492,778 B1 | 12/2002 | Segawa | .................... 315/169.3 |
| 2001/0036733 A1 | 11/2001 | Luo et al. | .................... 438/689 |

* cited by examiner

*Primary Examiner*—David Vu
(74) *Attorney, Agent, or Firm*—Duane Morris LLP

(57) ABSTRACT

An electroluminescence display device comprising a thin film transistor and an electroluminescence element wherein the electroluminescence element's anode and a portion of the thin film transistor's source/drain electrode are deposited on to a same surface and the electroluminescence element's anode and the portion of the thin film transistor's source/drain electrode overlap and make an electrical contact with improved contact resistance.

18 Claims, 4 Drawing Sheets

THIN FILM TRANSISTOR ORGANIC LIGHT EMITTING DIODE STRUCTURE

FIELD OF THE INVENTION

The present invention relates to an electroluminescence (EL) display device, and more particularly to an EL display device comprising an EL element and a thin film transistor (TFT) that is employed as a switching element for the EL element.

BACKGROUND OF THE INVENTION

In a conventional EL display device, such as a TFT Organic Light Emitting Diode (TFT-OLED), one of the electrodes of the EL element contacts either the source or the drain electrode of the associated TFT device through a contact via hole in the underlying passivation layer. For example, schematically illustrated in FIG. 1 is a cross-sectional view of a conventional TFT-OLED device. The TFT-OLED device is composed of a TFT device 100 and an OLED device 200 that are formed on top of a substrate 10. The substrate 10 in this example is a semiconductor material and, thus, insulating buffer films 11 and 12 of silicon nitride and silicon oxide, respectively, are first formed on the substrate 10. The substrate also may be formed of glass, synthetic resin, or the like also. In which case the buffer films 11 and 12 are not necessary.

The TFT device 100 is formed by first depositing an active layer 102 of a polysilicon film. The active layer 102 is doped on the outer sides to form a source 102S and a drain 102D regions with a channel region 102C in between. A blanket of gate oxide insulation film 20 is then deposited over the active layer 102, covering the active layer 102 as well as the rest of the substrate. A gate electrode 120, typically of a chromium and molybdenum, is then deposited on the gate oxide insulation film 20 positioned directly over the channel region 102C. Next, a blanket of interlayer dielectric (ILD) insulation layer 22 is provided, covering the gate electrode 120 and the rest of the gate oxide insulation film 20. The ILD layer 22 is typically made from silicon nitride or silicon oxide. Via holes 111 and 112 are etched through the two insulation layers, ILD layer 22 and the gate oxide insulation film 20, and down to the drain region 102D and the source region 102S. A drain electrode 110D and a source electrode 110S are formed by filling the respective via holes 111 and 112 with a metal such as aluminum. A first passivation layer 30 is then provided over the entire surface covering the source and drain electrodes 110S, 110D and the necessary structures for the TFT device 100 is now fully formed.

The first passivation layer 30 forms the surface on which the OLED device 200 is formed. To form the OLED device 200, a contact via hole 212 is first etched into the first passivation layer 30 over the source electrode 110S. A transparent electrode constituting the anode 210 of the OLED is deposited on the surface of the first passivation layer 30 including the contact hole 212 so that the anode 210 makes electrical contact with the source electrode 110S through the contact hole 212. The anode 210 is made of a transparent electrically conductive material, typically indium-tin-oxide (ITO). A second passivation layer 32 is provided over the entire surface and an opening is etched into the second passivation layer 32 exposing the anode 210 in the region corresponding to the location of the OLED device 200 being formed. This opening defines a pixel in a display formed by a matrix of these EL display devices and an organic EL emitter layer 215 is deposited over the anode 210 in the opening region. Finally, a cathode 220, typically of aluminum is deposited over the emitter layer 215 completing the OLED structure.

When an appropriate bias potential is created between the anode 210 and the cathode 220, holes and electrons injected from the anode 210 and cathode 220, respectively, are recombined in the emitter layer 215 causing the emitter layer to emit energy as light through the transparent anode 210 and the substrate 10.

In the conventional EL display device, such as the conventional TFT-OLED structure illustrated in FIG. 1, because the electrical contact between the anode 210 of the EL element and the source electrode 110S is made through the contact hole 212, which is small, the contact resistance tends to be high. Typically, the contact holes 212 are about 5–10 um in diameter and the typical contact resistance between aluminum metal and ITO contacting through such a structure is about 50 ohms. This high contact resistance requires more power to drive the EL element. Improving the contact between the anode 210 and the source electrode 110S and lowering the contact resistance would improve the EL display device's power demand.

Another problem with the conventional EL display device structure is that it is difficult to produce an anode layer having a desired flatness. Because the anode 210 of the EL element is deposited over a number of underlying layers of insulation films, it is difficult to control the surface roughness of the anode layer. For a reliable performance of the EL element, it is preferred that the anode 210 meet the flatness (or surface roughness) of Rms<10 Å and Rpv<100 Å.

Thus, an improved EL display device is desired.

SUMMARY OF THE INVENTION

According to an aspect of the present invention, an improved electroluminescence (EL) display device comprises a thin-film transistor (TFT) and an EL element successively formed on a substrate. The EL element may be a light emitting device such as an Organic Light Emitting Diode (OLED) and the TFT is used to drive the EL element. The substrate is transparent and may be formed of non-conductive materials such as glass, synthetic resin, or the like. It may also be formed of a semiconductor or conductive material, in which case, the substrate is passivated with one or more insulating films of silicon oxide or silicon nitride before the TFT device and the EL element are formed on the substrate.

The basic structure of the TFT is same as the conventional TFT device of FIG. 1 and includes a source electrode, a drain electrode, and a gate electrode. But, in this embodiment of the present invention, the gate oxide insulation film and ILD layer extending into the EL element area are removed so that the anode of the EL element can be deposited directly on the substrate. Before the anode is deposited, the source electrode is deposited first so that a portion of the source electrode is disposed directly on the substrate. Alternatively, the drain electrode may be the one that has a portion disposed directly on the substrate.

The EL element includes a transparent anode layer, a cathode layer and an EL emitter layer disposed between the anode and the cathode layer. These layers are deposited on the substrate with anode directly on the substrate first, EL emitter layer on the anode, and the cathode deposited on the EL emitter layer.

Next, the EL element's anode is deposited on the substrate so that a portion of the EL element's anode overlaps and enshrouds the portion of the TFT's source electrode that is directly on the substrate. An important feature of this resulting structure is that the TFT's source electrode and the EL element's anode contact each other at the overlapping region without any intervening structure or materials therebetween. During the process of forming the TFT on the substrate, the source electrode is deposited with a portion directly on the substrate. The EL element's anode is, then, deposited on the substrate near the TFT so that an edge portion of the anode overlaps the source electrode and enshrouds an edge surface of the source electrode. The anode contacts the edge surface and the top surface of the source electrode. The result is that the contact area between the anode and the source electrode is larger than the contact made through a contact via hole in the conventional structures. Hence, the contact resistance between the anode and the source electrode is lower and, in turn, lowering the power demand of the EL display device. In another embodiment of the present invention, the order of depositing the EL element's anode and the TFT's source electrode may be reversed. The EL element's anode may be deposited first on the substrate and the TFT's source electrode is deposited with a portion directly on the substrate and overlapping the EL element's anode.

In yet another embodiment of the present invention, at least one of the gate oxide insulation film and the interlayer dielectric (ILD) insulation layer of the TFT device remains intact under the EL element. The TFT's source electrode and EL element's transparent anode are deposited on top of one the insulation film layers rather than the substrate.

It would be obvious to one of ordinary skill in the art that the designations, source and drain, for the TFT electrodes are related to their electrical functionality in a given configuration and they may be reversed. This, in turn, also applies to the functional designations, anode and cathode, for the EL element. These designations for the electrodes may be reversed without deviating from the spirit of the present invention. Thus, in another embodiment of the present invention, the EL element's transparent electrode layer may be its cathode and the overlapping contact discussed above may be formed between the EL element's cathode and the TFT's drain electrode.

BRIEF DESCRIPTION OF THE DRAWING

The invention will be better understood from the following detailed description of an exemplary embodiment thereof in conjunction with the accompanying drawing in which.

Same reference numerals are used to denote like parts throughout the various figures.

DETAILED DESCRIPTION

Figure 2:
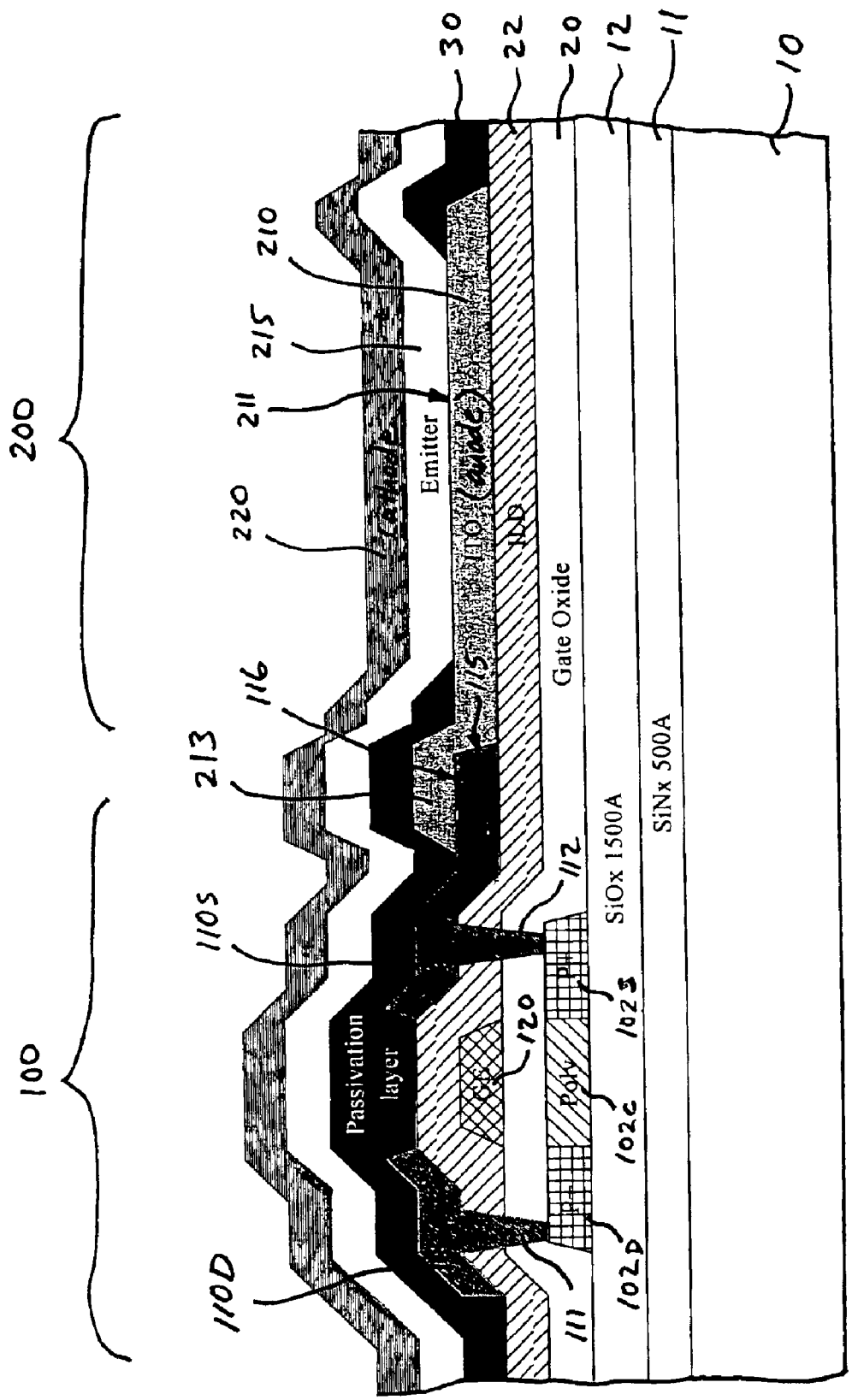
FIG. 2 is a schematic cross-sectional view of an improved EL display device according to an embodiment of the present invention.

Referring to FIG. 2, an improved electroluminescence (EL) display device according to an embodiment of the present invention is disclosed. The EL display device comprises a thin-film-transistor (TFT) and an EL element 200 formed on a substrate 10. The EL element in this embodiment is an organic light emitting diode and the TFT is used to drive the EL element 200. The substrate 10 is transparent and may be formed of a non-conductive material, such as, glass, synthetic resin, or the like. It may also be formed of a conductive or semiconductor material, in which case, the substrate 10 is usually passivated with one or more insulating films of silicon oxide and silicon nitride before the TFT 100 and the EL element 200 are formed on the substrate.

Figure 1:
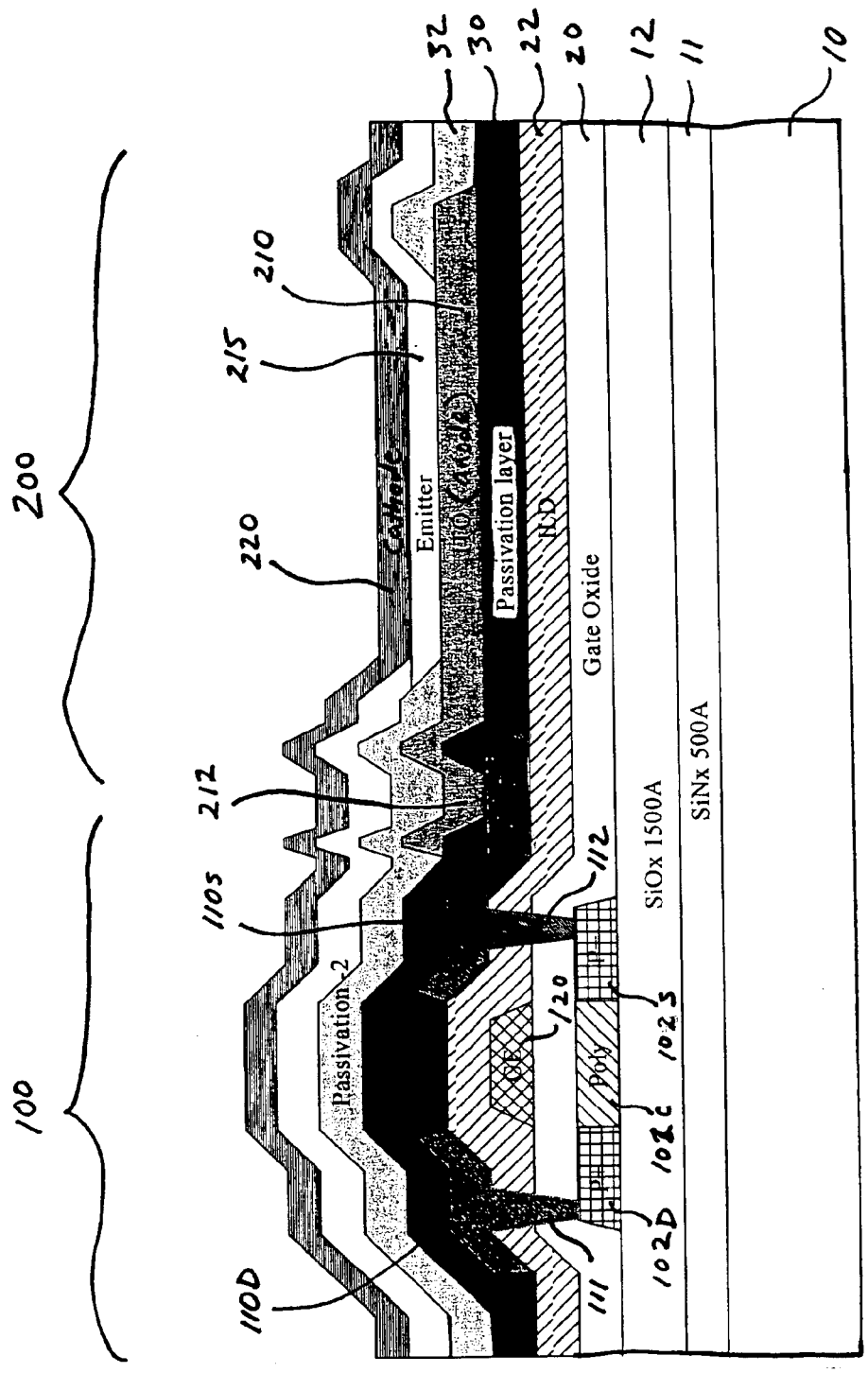
FIG. 1 is a schematic cross-sectional view of a conventional EL display device.

The TFT 100 in this embodiment of the present invention has the same structure as the TFT device in the conventional EL display device illustrated in FIG. 1. But, after the source/drain electrodes 110S and 110D are deposited on the ILD layer 22, rather than covering the TFT structure with a passivation layer, the EL element's anode 210 is deposited directly on to the ILD layer 22 so that both the TFT's source electrode and the EL element's anode 210 are deposited on the ILD layer 22. The EL element's transparent anode 210, typically of indium-tin-oxide (ITO), is deposited on the ILD layer 22 so that an edge portion 213 of the anode 210 overlaps and enshrouds the portion of the source electrode 110S that is deposited directly on the ILD layer 22. The source electrode 110S has an edge surface 115 and a top surface 116 that directly contact the EL element's anode 210. In other words, the anode 210 and the edge surface 115 and the top surface 116 make a contact without any intervening layers so as to maximize the contact area among these surfaces. The contact formed between the anode's edge portion 213 and the source electrode 110S has a substantially larger contact area than the contact formed through the contact hole 212 in the conventional EL display device illustrated in FIG. 1. Because of the larger contact area, the electrical contact resistance between the EL element's anode 210 and the TFT's source electrode 110S is lower, resulting in a lower power demand. Although this embodiment of the present invention is illustrated with the source electrode 110S having two distinct surfaces, the edge surface 115 and the top surface 116, the edge of the source electrode 110S may have many variety of surface configuration depending on the needs of the particular application without deviating from the spirit of the present invention.

Subsequently, a blanket of passivation layer 30, typically of silicon nitride is deposited covering the TFT's source and drain electrodes 110S and 110D. A portion of the passivation layer 30 over the EL element's anode 210 is removed exposing a portion 211 of the anode 210. The EL element 200 is completed by depositing an emitter layer 215 of an organic compound and a cathode layer 220 of an opaque electrically conductive material such as aluminum.

Figure 3:
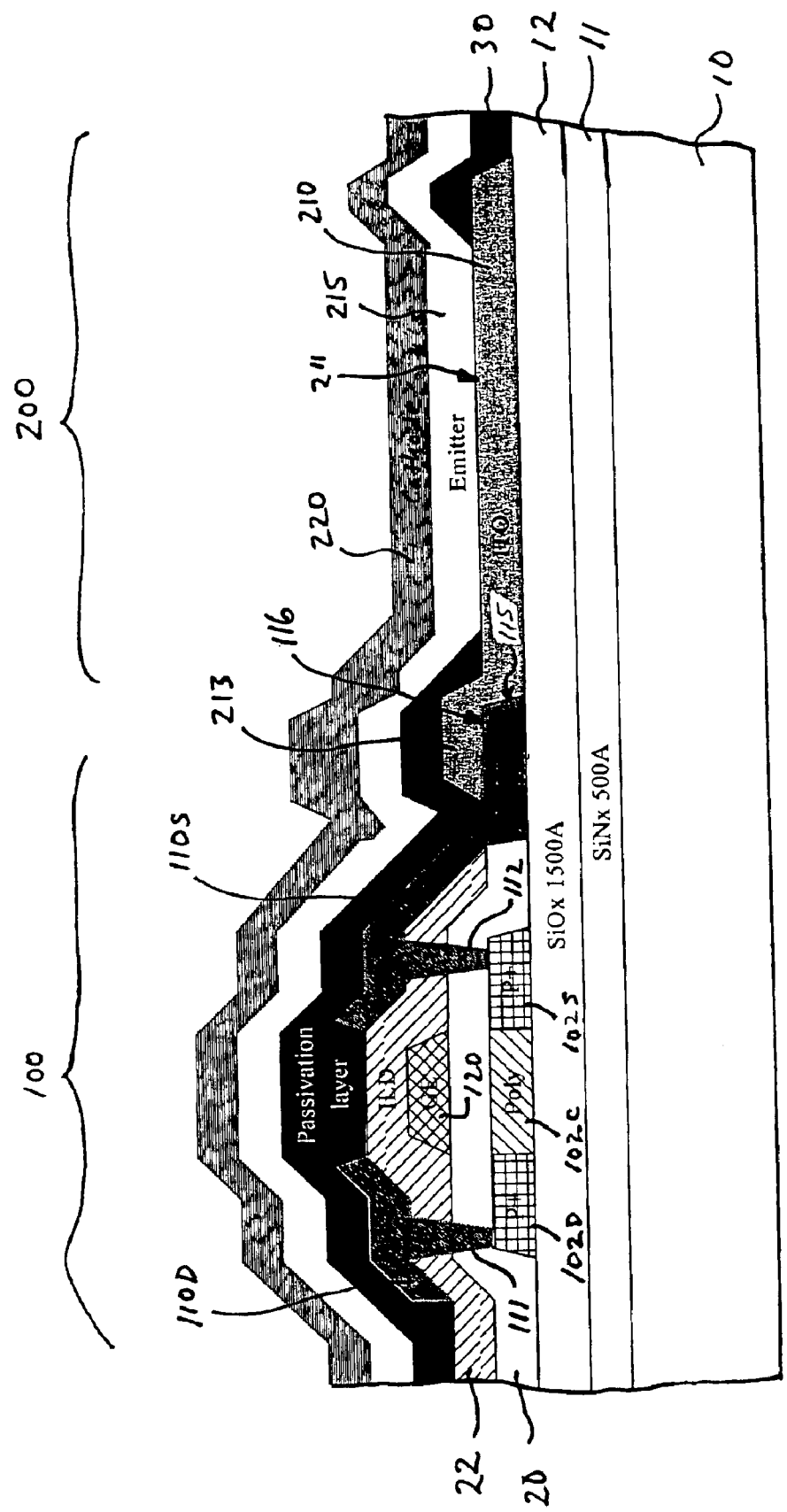
FIG. 3 is a schematic cross-sectional view of an improved EL display device according to another embodiment of the present invention.

Referring to FIG. 3, an improved EL display device according to another aspect of the present invention is disclosed. In this embodiment of the present invention, the gate oxide insulation film 20 and the ILD layer 22 are removed from the EL element region by an appropriate etching process so that the EL element 200 can be formed directly on the substrate 10. In this embodiment of the present invention, the substrate 10 is a semiconductor and, thus, its surface is insulated with insulation buffer films 11 and 12 of silicon nitride and silicon oxide, respectively. If the substrate 10 were non-conductive material such as glass, the buffer insulation layers 11 and 12 would not be necessary and the EL element 200 may be formed directly on the substrate 10.

After the gate oxide insulation film 20 and the ILD layer 22 are removed from the EL element region of the substrate, the source electrode 110S and the drain electrode 110D are deposited. As illustrated, the source electrode 110S is provided over the source 102S and extends towards the EL element region and down to the exposed insulation buffer film 12 so that a portion of the source electrode 110S is directly deposited on the insulation buffer film 12 (or the substrate 10 if the buffer films are not used). Next, the EL element's transparent anode 210 is deposited on the substrate's insulation buffer film 12 with an edge portion 213 of the anode 210 overlapping the portion of the source electrode 110S that is sitting directly on the insulation buffer film 12. The anode's edge portion 213 enshrouds the source electrode's edge surface 115 and top surface 116. The contact thus formed between the anode 210 and the source electrode 110S has a lower electrical contact resistance than that of the conventional EL display device illustrated in FIG. 1.

The TFT 100 and the EL element 200 are then completed by depositing the passivation layer 30, the emitter layer 215 and the cathode layer 220, successively in that order, as described above in reference to the embodiment of the present invention illustrated in FIG. 2.

Figure 4:
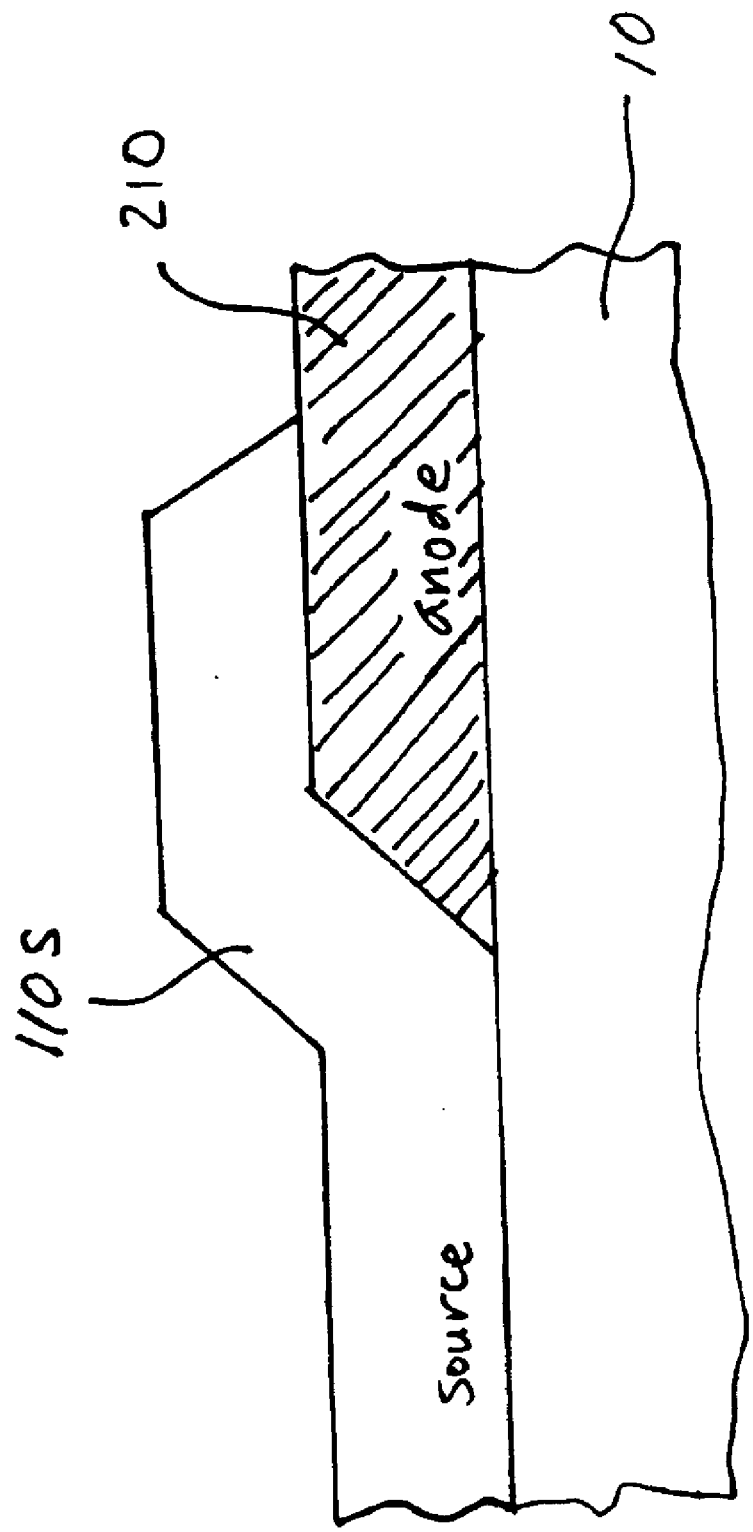
FIG. 4 is a schematic cross-sectional view of the contact region between a TFT's source electrode and an EL element's anode according to another embodiment of the present invention.

In the various embodiments of the present invention described above, it should be noted that the order of depositing the TFT's source electrode 110S and the EL element's anode 210 may be reversed. Illustrated in FIG. 4 is the resulting structure where the anode 210 is deposited first on the substrate 10 and the source electrode 110S is subsequently deposited over the anode enshrouding the edge portion of the anode 210.

While the foregoing invention has been described with reference to the above embodiments, various modifications and changes can be made without departing from the spirit of the invention. Accordingly, all such modifications and changes are considered to be within the scope of the appended claims.

What is claimed is:

1. An electroluminescence display device comprising:
   a substrate;
   a thin-film transistor formed on the substrate, the thin-film transistor including a source electrode, a drain electrode, and a gate electrode; wherein a portion of at least one of the source electrode and the drain electrode is directly disposed on the substrate;
   an EL element formed on the substrate, the EL element comprising:
      a first electrode directly disposed on the substrate;
      an electroluminescent emitter layer disposed on the first electrode layer;
      a second electrode formed on the electroluminescent emitter layer such that the electroluminescent emitter layer is disposed between the first and second electrodes; and
   wherein a portion of the electroluminescence element's first electrode contacts the portion of at least one of the source electrode and the drain electrode that is directly disposed on the substrate.

2. An electroluminescence display device of claim 1, wherein the portion of at least one of the source electrode and drain electrode that is directly disposed on the substrate having an edge surface and a top surface that directly contact the electroluminescence element's first electrode.

3. An electroluminescence display device of claim 1, wherein the electroluminescence element is an organic light emitting diode.

4. An electroluminescence display device of claim 1, wherein the substrate includes at least one insulation buffer film on its top surface on which the thin-film transistor and the electroluminescence element are formed.

5. An electroluminescence display device of claim 4, wherein the at least one insulation buffer film is a silicon nitride layer.

6. An organic electroluminescence device of claim 4, wherein the at least one insulation buffer film is a silicon oxide layer.

7. An electroluminescence display device comprising:
   a substrate;
   a thin-film transistor formed on the substrate, the thin-film transistor including a source electrode, a drain electrode, and a gate electrode; wherein a portion of at least one of the source electrode and the drain electrode is directly disposed on the substrate;
   an electroluminescence element formed on the substrate, the electroluminescence element comprising:
      a first electrode directly disposed on the substrate;
      an electroluminescent emitter layer disposed on the first electrode layer;
      a second electrode formed on the electroluminescent emitter layer such that the electroluminescent emitter layer is disposed between the first and second electrodes thereby forming the electroluminescence element; and
   wherein the portion of at least one of the source electrode and the drain electrode that is directly disposed on the substrate also contacts the first electrode of the electroluminescence element.

8. An electroluminescence display device of claim 7, wherein the first electrode of the electroluminescence element having an edge surface and a top surface that directly contact the portion of at least one of the source electrode and the drain electrode that is directly disposed on the substrate.

9. An electroluminescence display device of claim 7, wherein the electroluminescence element is an organic light emitting diode.

10. An electroluminescence display device of claim 7, wherein the substrate includes at least one insulation buffer film on its top surface on which the thin-film transistor and the electroluminescence element are formed.

11. An electroluminescence display device of claim 10, wherein the at least one insulation buffer film is a silicon nitride layer.

12. An organic electroluminescence device of claim 10, wherein the at least one insulation buffer film is a silicon oxide layer.

13. An electroluminescence display device comprising:
   a substrate;
   a thin-film transistor formed on the substrate, the thin-film transistor including a source electrode, a drain electrode, and a gate electrode; wherein a portion of at least one of the source electrode and the drain electrode is directly disposed on an insulation layer on the substrate;
   an electroluminescence element formed on the substrate, the electroluminescence element comprising:
      a first electrode directly disposed on the insulation layer;
      an electroluminescent emitter layer disposed on the first electrode layer;
      a second electrode formed on the electroluminescent emitter layer such that the electroluminescent emitter layer is disposed between the first and second electrodes; and
   wherein a portion of the electroluminescence element's first electrode contacts the portion of at least one of the source electrode and the drain electrode that is directly disposed on the insulation layer.

14. An electroluminescence display device of claim 13, wherein the insulation layer is an insulation buffer film on the substrate.

15. An electroluminescence display device of claim 13, wherein the insulation layer is a gate oxide insulation film.

16. An electroluminescence display device of claim 13, wherein the insulation layer is an interlayer dielectric layer.

17. An electroluminescence display device of claim 13, wherein the portion of at least one of the source electrode and drain electrode that is directly disposed on the insulation layer having an edge surface and a top surface that directly contact the electroluminescence element's first electrode.

18. An electroluminescence display device of claim 13, wherein the electroluminescence element is an organic light emitting diode.

* * * * *